United States Patent
Toyama (10) Patent No.: US 7,956,424 B2
(45) Date of Patent: Jun. 7, 2011

(54) MIRROR BIT MEMORY DEVICE APPLYING A GATE VOLTAGE ALTERNATELY TO GATE

(75) Inventor: Fumiaki Toyama, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 75 days.

(21) Appl. No.: 12/192,923

(22) Filed: Aug. 15, 2008

(65) Prior Publication Data

US 2009/0212348 A1    Aug. 27, 2009

(30) Foreign Application Priority Data

Aug. 17, 2007   (JP) ................... 2007-212945

(51) Int. Cl.
*H01L 29/76* (2006.01)
*H01L 21/336* (2006.01)
(52) U.S. Cl. ............... 257/390; 257/401; 257/E21.662; 257/E21.679; 438/257; 438/288
(58) Field of Classification Search ............ 257/324, 257/390, 401, E21.662, E21.679; 438/257, 438/288; 365/185.05, 189.011
See application file for complete search history.

(56) References Cited

U.S. PATENT DOCUMENTS 6,545,893 B2 *   4/2003   Kunikiyo ................. 365/51

* cited by examiner

*Primary Examiner* — Hsien-ming Lee (57) ABSTRACT

A semiconductor device and a method for manufacturing thereof are provided. The semiconductor device includes: an ONO film including a charge storage layer on a semiconductor substrate; a plurality of bit lines each extending inside the semiconductor substrate; a plurality of interspaces each interposed between the adjacent bit lines; a plurality of gates each provided along the bit line on the ONO film above the interspaces; and a plurality of word lines electrically coupled with the corresponding gates formed on one of the interspaces, each extending to intersect with the bit lines. The two gates adjacent with each other in a width direction of the bit line are connected to different word lines.

10 Claims, 13 Drawing Sheets

FIG.1A

Prior Art

FIG.1B

Prior Art

FIG.2

Prior Art

MIRROR BIT MEMORY DEVICE APPLYING A GATE VOLTAGE ALTERNATELY TO GATE

CLAIM OF PRIORITY

This application claims priority from Japanese patent application 2007-212945 filed on Aug. 17, 2007.

TECHNICAL FIELD

The present invention relates to a semiconductor device and a method for manufacturing thereof. More particularly, the present invention relates to a semiconductor device provided with a non-volatile memory cell and a method for manufacturing thereof.

BACKGROUND OF THE INVENTION

Recently, the usage of non-volatile memory comprising a semiconductor device capable of rewriting data and retaining data stored therein even while the device is un-powered has become increasingly popular. Flash memory is one example of non-volatile memory. A typical flash memory is provided with a transistor which operates as a memory cell and includes a floating gate or an insulating film called a charge storage layer for accumulating electrons used to store data. Flash memory with a SONOS (Silicon Oxide Nitride Oxide Silicon) structure for accumulating the electrons in a trap layer of an ONO (Oxide Nitride Oxide) film has been introduced as the flash memory using an insulating film as the charge storage layer. U.S. Pat. No. 6,011,725 discloses a flash memory with a SONOS structure, which has a virtual ground type memory cell where the switching operation is performed between a source and a drain so as to be symmetrically operated.

Figure 1A:
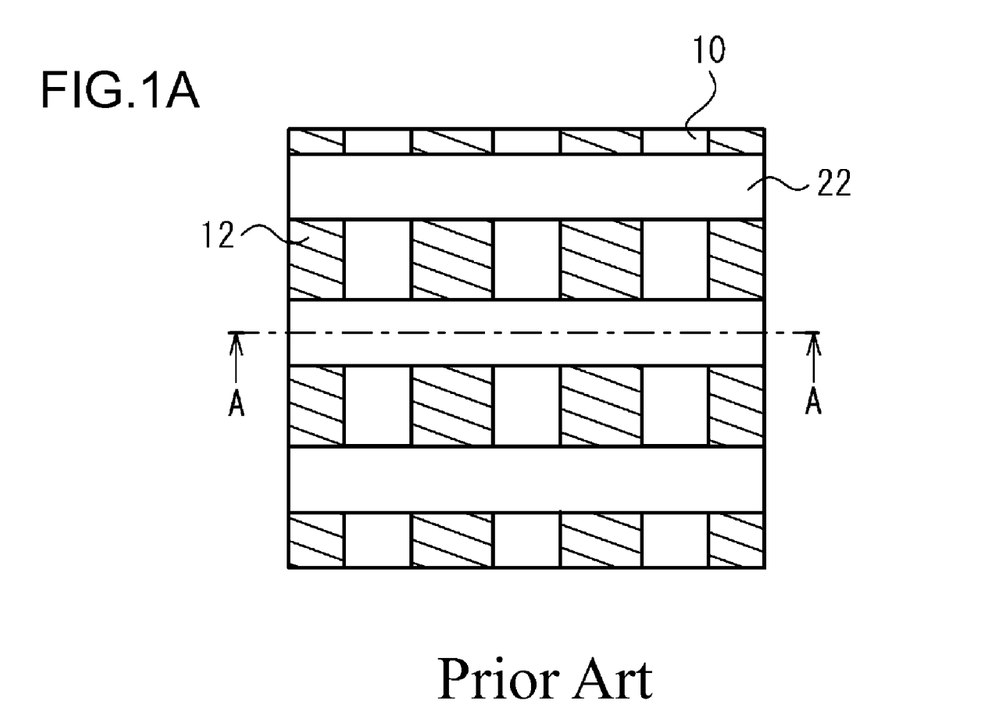
FIG. 1A is a top view of a conventional flash memory.
Figure 1B:
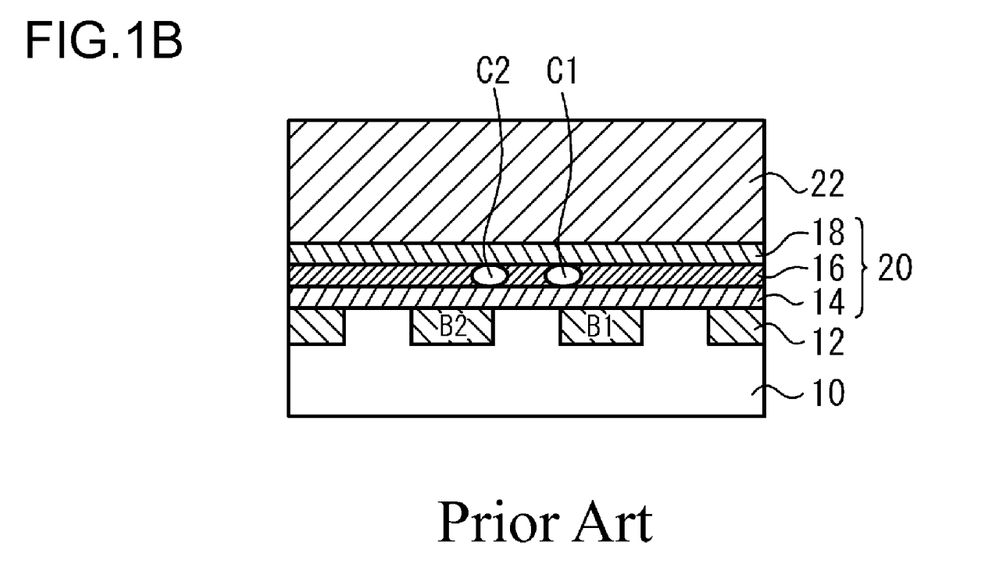
FIG. 1B is a sectional view taken along line A-A shown in FIG. 1A.

FIG. 1A is a top view of a conventional flash memory. FIG. 1B is a sectional view taken along the line A-A shown in FIG. 1A. FIG. 1A shows a bit line 12 seen through an ONO film 20. A plurality of bit lines 12 extend in a semiconductor substrate 10 as shown in FIGS. 1A and 1B. The ONO film 20 formed of a tunnel insulating film 14, a charge storage layer 16, and a top insulating film 18 is applied on the semiconductor substrate 10. A plurality of word lines 22 which extend to intersect with the bit lines 12 are formed on the ONO film 20. The bit line 12 serves as both a source and a drain, and the word line 22 also serves as a gate. In the case where the bit lines 12 (B1) and 12 (B2) are set to the source and the drain, respectively, a high electric field is applied to the region between the source and the drain to store electrons in a charge storage region C1. Meanwhile, electrons may be stored in a charge storage region C2 by switching the source and the drain. In this way, the source and the drain may be symmetrically operated to form two charge storage regions in the charge storage layer 16 between the source and the drain of a single transistor. This makes it possible to record two bits in the single transistor.

A general trend in the development of semiconductor devices has been to miniaturize (e.g., reduce the size of) the devices. Typically, this is accomplished by reducing the underlying components comprising the semiconductor device, such as the transistors. However, in order to miniaturize a memory cell, the space between adjacent bit lines in the transistor has to be reduced. As the bit line is formed by diffusing impurities, the impurities are required to be shallowly buried to reduce the space between the bit lines. Subsequently, the bit line is formed to have a small depth.

Figure 2:
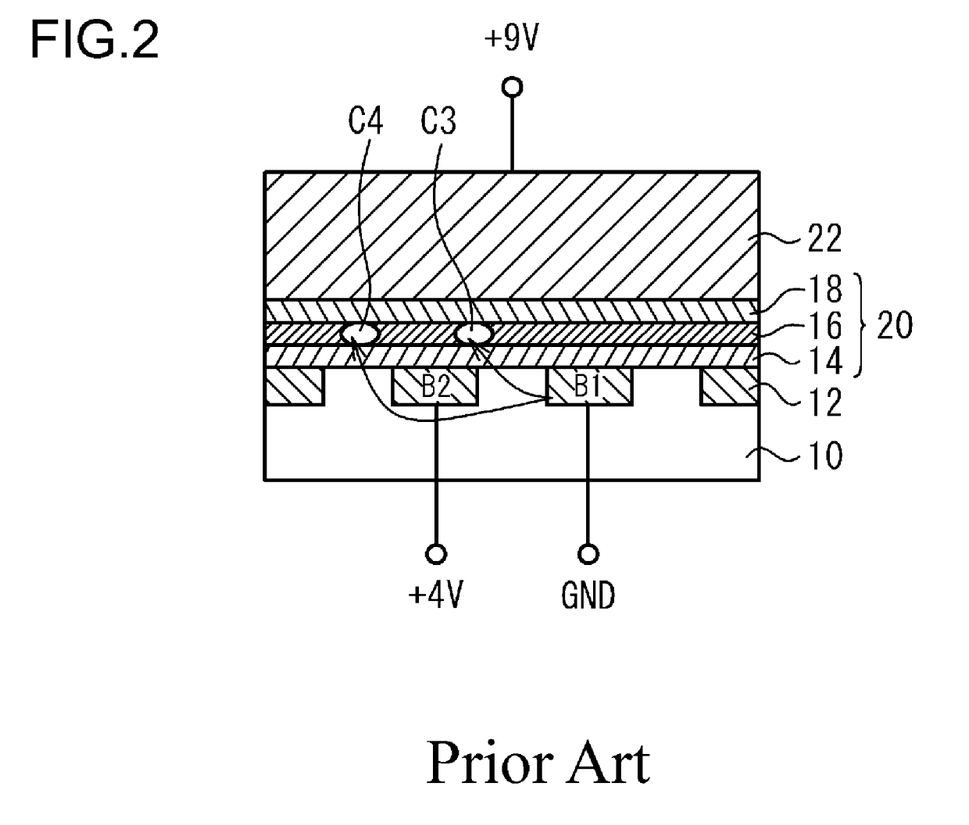
FIG. 2 is a sectional view depicting a problem of a conventional flash memory.

Unfortunately, when the depth of a bit line is small, some of the electrons jump over the bit line to proceed toward the adjacent cell. FIG. 2, depicts the case where the bit line 12 has a small depth. As shown in FIG. 2, the bit line 12 (B1) is connected to the ground (hereinafter referred to as GND), and the bit line 12 (B2) receives a voltage of +4V, for example. The word line 22 receives a voltage of +9V. Otherwise, the structure is identical to that of the one shown in FIG. 1B. In FIG. 2, electrons are accumulated in a charge storage region C3 in a charge storage layer 16 under a hot electron effect. When the depth of the bit line 12 is small, some of the electrons jump over the bit line 12 (B2) to proceed toward the adjacent cell. A voltage of +9V is applied to the word line 20 common to the adjacent cells. The electrons which have jumped over the bit line 12 (B2) are accumulated in a charge storage region C4 of the adjacent cell. TPD (Transient Program Disturb) occurs when the electrons jump over the bit line 12 so as to be stored in the charge storage region of the adjacent cell. Reduction in the space between the bit lines 12 may cause the TPD, and it is thus difficult to miniaturize the memory cell.

SUMMARY OF THE INVENTION

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

According to an aspect of the present invention, there is provided a semiconductor device including a charge storage layer formed on a semiconductor substrate, a plurality of bit lines each extending inside the semiconductor substrate, a plurality of interspaces each interposed between the bit lines adjacent with each other, a plurality of gates formed on the charge storage layer above the interspaces along a longitudinal direction of the bit line, and a plurality of word lines electrically coupled with the gates formed on one of the interspaces, each extending to intersect with the bit lines. The two gates are adjacent with each other in a width direction of the bit line and are connected to different word lines. The structure having the electrically separated gates arranged at the interval of the single cell allows different voltages to be applied to the two adjacent gates in the width direction of the bit line. Therefore, even if an electron jumps over the bit line to proceed toward the adjacent cell, it is not stored in the charge storage region of the adjacent cell. In other words, TPD (Transient Program Disturb) can be suppressed from occurring. This makes it possible to reduce the size of a memory cell.

In the above-described structure, the word line electrically coupled with one of the two adjacent gates in the width direction of the bit line may be electrically coupled with one of the gates disposed in the width direction of the bit line with respect to one of the two adjacent gates. As the word line is allowed to extend in the width direction of the bit line, a memory cell array can be formed into a rectangular shape so as to be mounted on a package using a conventional wiring substrate.

In addition, the word line electrically coupled with one of the two adjacent gates in the width direction of the bit line may be electrically coupled with the gate adjacent to the other gate of the two adjacent gates in the width direction of the bit line at a side opposite the one of the two adjacent gates. Alternatively, the word line electrically coupled with one of the two adjacent gates in the width direction of the bit line may be electrically coupled with the gate adjacent to the other gate of the two adjacent gates in a longitudinal direction of the bit line. Through either of these methods, a reduction in the size of the memory cell array may be achieved.

The above-described structure may further include an insulating film to cover the gates. The word lines may be provided on the insulating film. Furthermore, the charge storage layer may be formed of a silicon nitride film. This makes it possible to provide a semiconductor device with a SONOS structure.

In the above-described structure, an electron may be stored in the charge storage layer using a hot electron effect. Accordingly, the likelihood of TBD in a semiconductor device may be suppressed. Likewise, in another embodiment, the semiconductor device may be of a virtual ground type with two different charge storage regions in the charge storage layer. This also makes it possible to suppress TPD in a semiconductor device in which TPD is likely to occur.

According to another aspect of the present invention, there is provided a method for manufacturing a semiconductor device which comprises: forming a charge storage layer on a semiconductor substrate; forming a plurality of bit lines to extend inside the semiconductor substrate; forming a plurality of gates on the charge storage layer above a plurality of interspaces each interposed between the bit lines adjacent with each other and along a longitudinal direction of the bit line; and forming a plurality of word lines electrically coupled with the gates on one of the interspaces, each extending to intersect with the bit lines such that the two adjacent gates are electrically coupled with the different word lines in a width direction of the bit line. In the method, the electrically separated gates can be arranged at the interval of the single cell such that different voltages are applied to two adjacent gates in the width direction of the bit line. Therefore, even if an electron jumps over the bit line to proceed toward the adjacent cell, the electron is not stored in the charge storage region of the adjacent cell, that is, the TPD can be suppressed from occurring. Accordingly, miniaturization of the memory cell is made possible.

In one embodiment, forming the bit lines may comprise: forming a plurality of conducting films each extending on the charge storage layer, forming the bit lines inside the semiconductor substrate using the conducting films as a mask. Forming the gates may include forming a mask layer extending to intersect with the conducting films on the conducting films, and forming the gates as the conducting films by etching the conducting films using the mask layer as the mask. The method allows the bit line to be formed in self alignment with the gate, and a plurality of gates to be easily formed along the longitudinal direction of the bit line.

In a further embodiment, the method may further comprise: forming an insulating film to cover the gates, respectively. When forming the word lines, the word lines may be formed on the insulating film.

In a still further embodiment, the method may further comprise: forming a first insulating film to cover the conducting films, the first insulating film being polished to be interposed between the conducting films prior to forming the gates; forming a second insulating film to cover the gates, the second insulating film being polished to be interposed between the adjacent gates in a longitudinal direction of the bit line subsequent to forming the gates; and forming a third insulating film on the first and the second insulating films. This makes it possible to easily form the insulating film to cover the gates, respectively.

Accordingly, the present invention is capable of suppressing the TPD, thus miniaturizing the memory cell.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, and components, have not been described in detail as not to unnecessarily obscure aspects and features of the subject matter.

Figure 3:
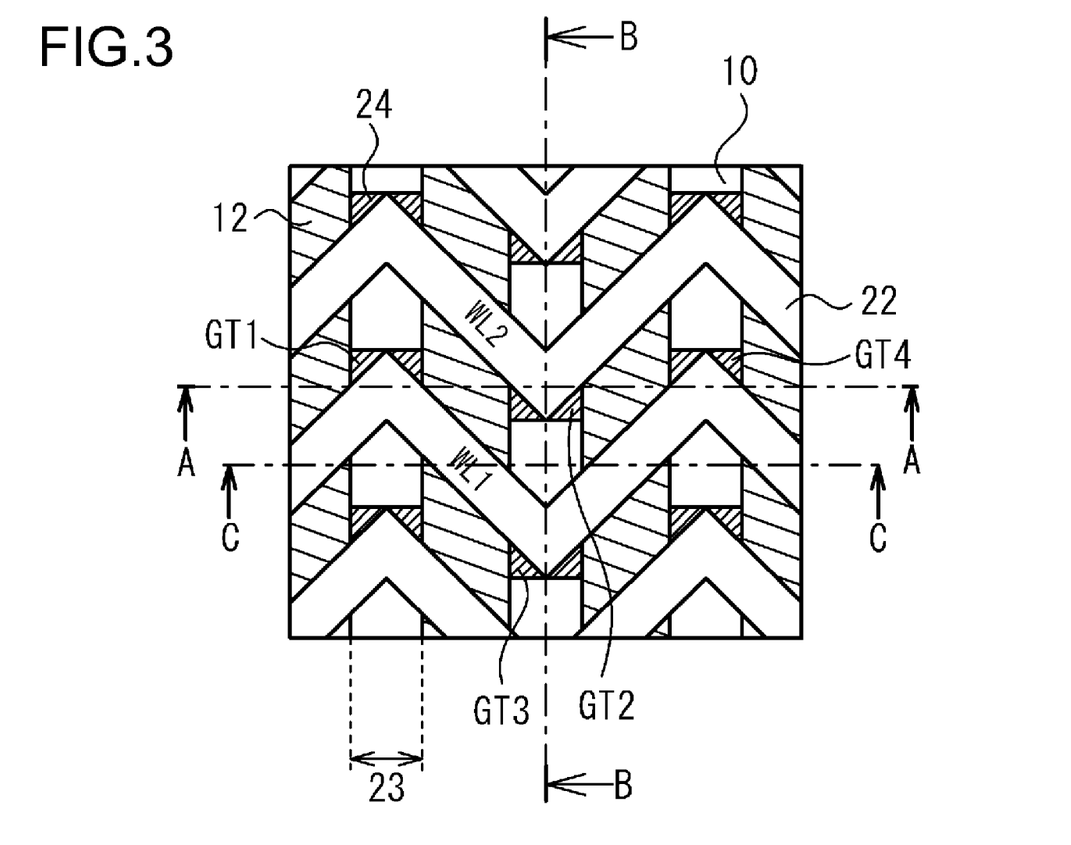
FIG. 3 is a top view of a flash memory according to a first embodiment of the present invention.
Figure 4A:
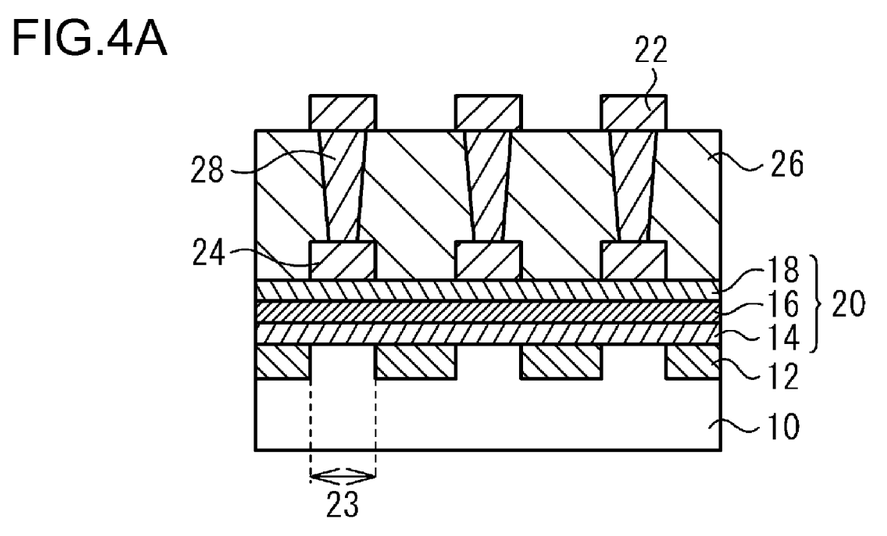
FIG. 4A is a sectional view taken along the line A-A shown in FIG. 3.
Figure 4B:
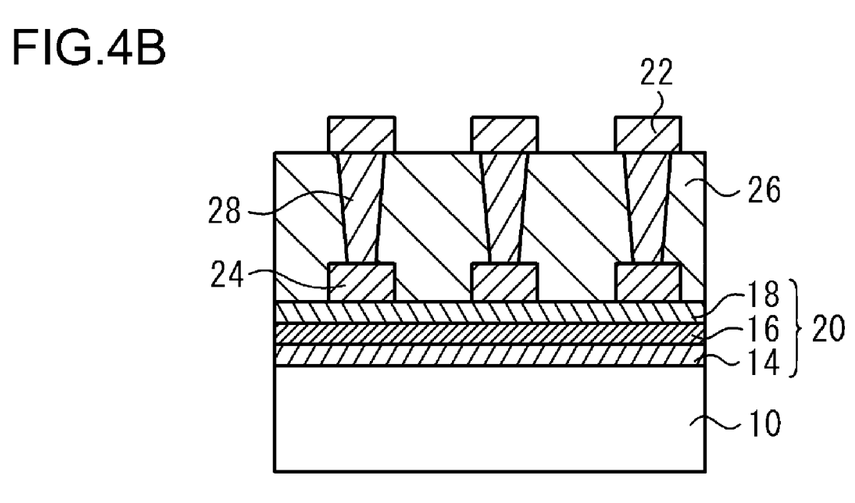
FIG. 4B is a sectional view taken along the line B-B shown in FIG. 3.

FIG. 3 is a top view of a flash memory according to a first embodiment of the present invention. FIG. 4A is a sectional view taken along the line A-A shown in FIG. 3, and FIG. 4B is a sectional view taken along the line B-B shown in FIG. 3. FIG. 3 shows gates 24, bit lines 12, and a semiconductor substrate 10 which are viewed through an insulating film 26 and an ONO film 20.

Referring to FIG. 3, a plurality of bit lines 12 are provided to extend in a semiconductor substrate 10. An interspace 23 is defined by the adjacent bit lines 12. Above the interspace 23, the gates 24, each formed of polysilicon, are formed along a longitudinal direction of the bit line 12. A plurality of word lines 22 electrically coupled with the gates 24 on the single interspace 23 correspondingly are formed on the gates 24 to intersect with the bit lines 12, extending to form a zigzag shape in the width direction of the bit line 12. In other words, the word line 22 (WL1) electrically coupled with one of the two adjacent gates 24 in the width direction of the bit line 12 (the gate 24 (GT1)), is electrically coupled with the gate 24 (GT3) adjacent to the other gate 24 (GT2) in the longitudinal direction of the bit line 12, and is further electrically coupled with the gate 24 (GT4) adjacent to the gate 24 (GT2) in the width direction of the bit line 12 at the side opposite the gate 24 (GT1). The two adjacent gates 24 (GT1 and GT2) in the width direction of the bit line 12 are electrically coupled with the different word lines 22 (WL1 and WL2).

The bit lines 12 are formed in the semiconductor substrate 10 as shown in FIGS. 4A and 4B. A tunnel insulating film 14, a charge storage layer 16 and a top insulating film 18 are sequentially layered to form an ONO film 20 on the semiconductor substrate 10. The gate 24 is formed on the ONO film 20 above the interspace 23 between the bit lines 12. The insulating film 26 is applied on the ONO film 20 to cover the respective gates 24. Plug metals 28 which pierce through the insulating film 26 are formed on the respective gates 24. The word lines 22 are formed on the respective plug metals 28. The gates 24 and the word lines 22 are electrically coupled via the plug metals 28.

A method for manufacturing the flash memory according to one embodiment will be described referring to FIGS. 5A to 12C. FIGS. 5A, 6A, 7A, 8A, 9A, 10A, 11A and 12A are top views each corresponding to FIG. 3. FIGS. 5B, 6B, 7B, 8B, 9B, 10B, 11B and 12B are sectional views each corresponding to the one taken along the line A-A shown in FIG. 3. FIGS. 8C, 9C, 10C, 11C and 12C are sectional views each corresponding to the one taken along line C-C shown in FIG. 3.

Figure 5A:
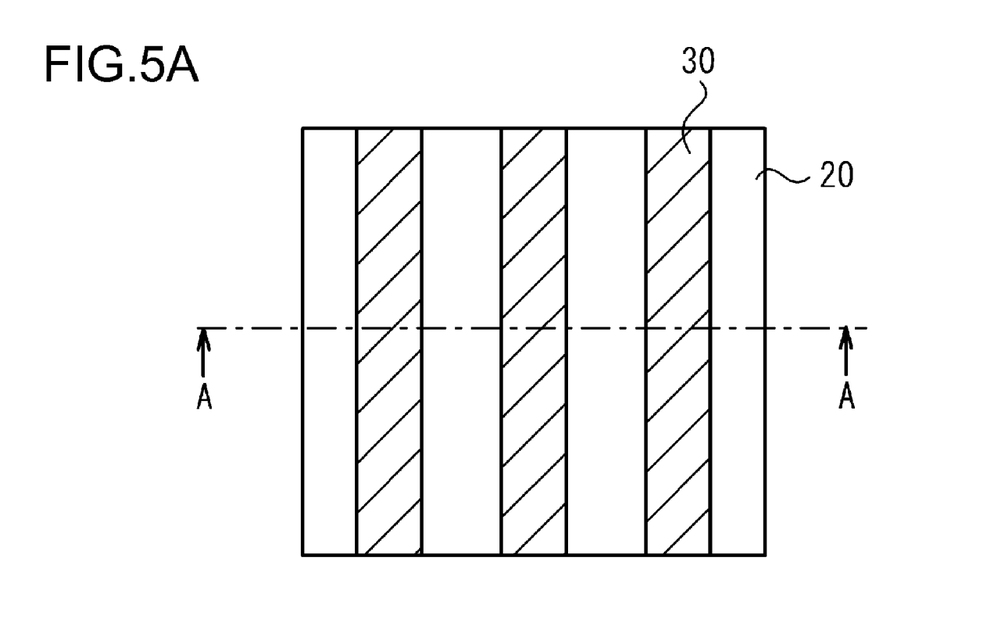
FIG. 5A is a top view showing formation of a tunnel insulating film, a charge storage layer, and a top insulating film in a method for manufacturing the flash memory according to one embodiment.
Figure 5B:
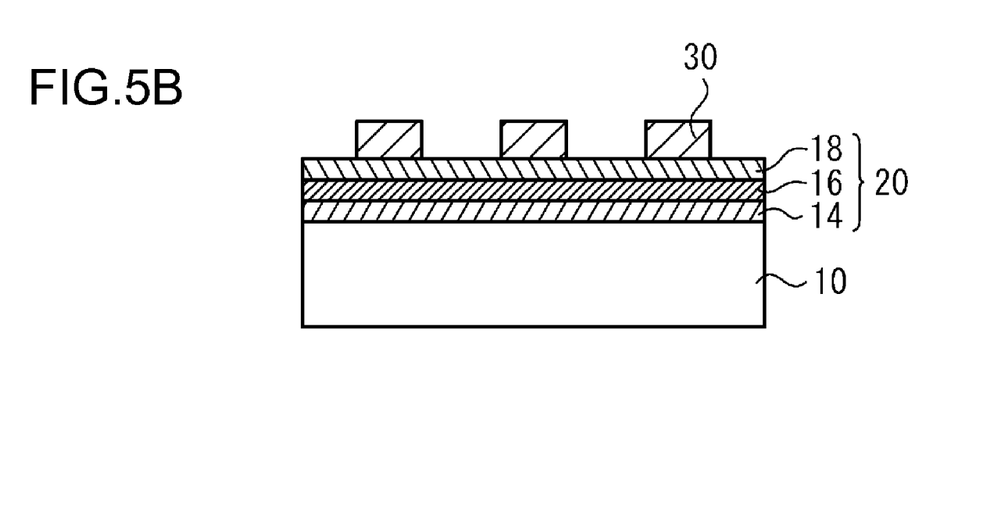
FIG. 5B is a sectional view corresponding to the one taken along line A-A shown in FIG. 3.

Referring to FIGS. 5A and 5B, the tunnel insulating film 14 as a silicon oxide film, the charge storage layer 16 as a silicon nitride film, and the top insulating film 18 as the silicon oxide film are sequentially formed on the semiconductor substrate 10 as a p-type silicon substrate (or a semiconductor substrate with a p-type silicon region). The ONO film 20 formed of: the tunnel insulating film 14, the charge storage layer 16 and the top insulating film 18, is formed on the semiconductor substrate 10. The silicon oxide film and the silicon nitride film may be formed through a CVD (Chemical Vapor Deposition) process. Polysilicon is deposited on the ONO film 20, and a photoresist with a predetermined pattern is used to etch the polysilicon to form a plurality of polysilicon conducting films 30 each extending in one direction.

Figure 6A:
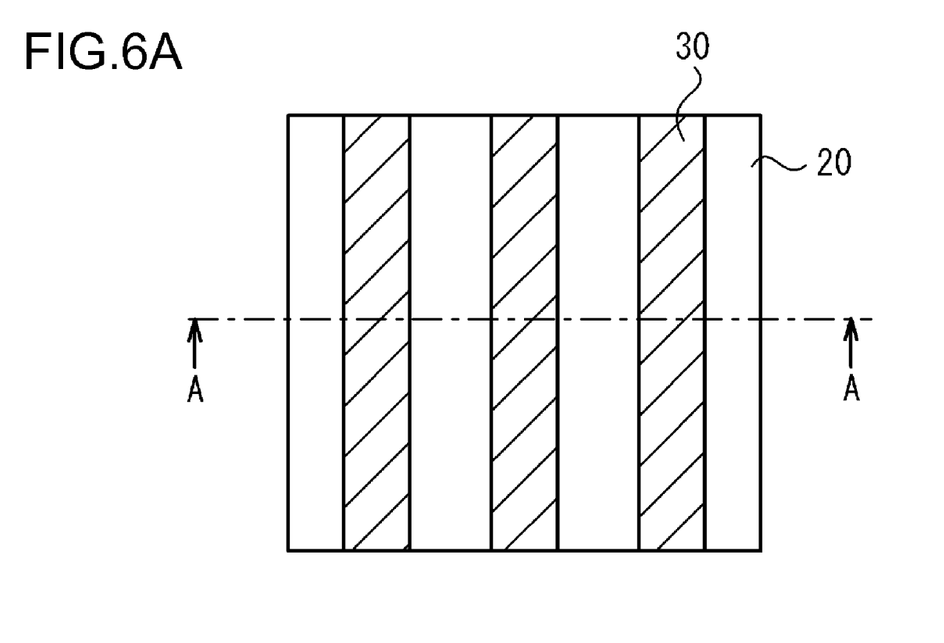
FIG. 6A is a top view showing implantation of an arsenic ion in a method for manufacturing the flash memory according one embodiment.
Figure 6B:
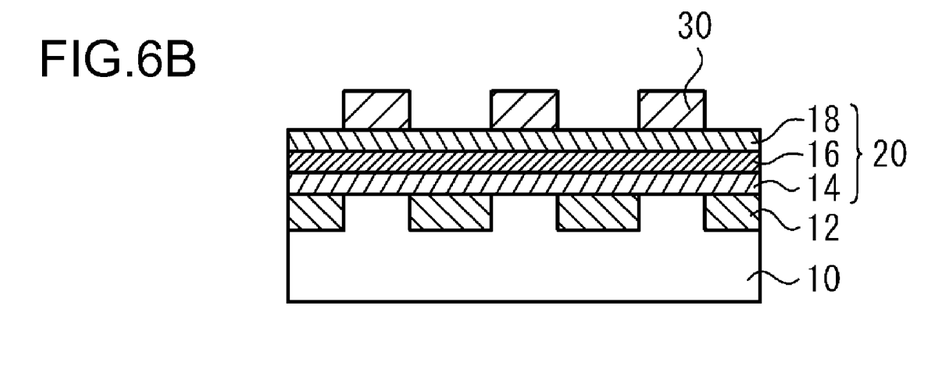
FIG. 6B is a sectional view corresponding to the one taken along line A-A shown in FIG. 3.

Referring to FIGS. 6A and 6B, an arsenic ion, for example, is implanted into the semiconductor substrate 10 using the conducting films 30 as a mask, and thermal processing is performed to form the bit lines 12 each as an N-type diffusion layer.

Figure 7A:
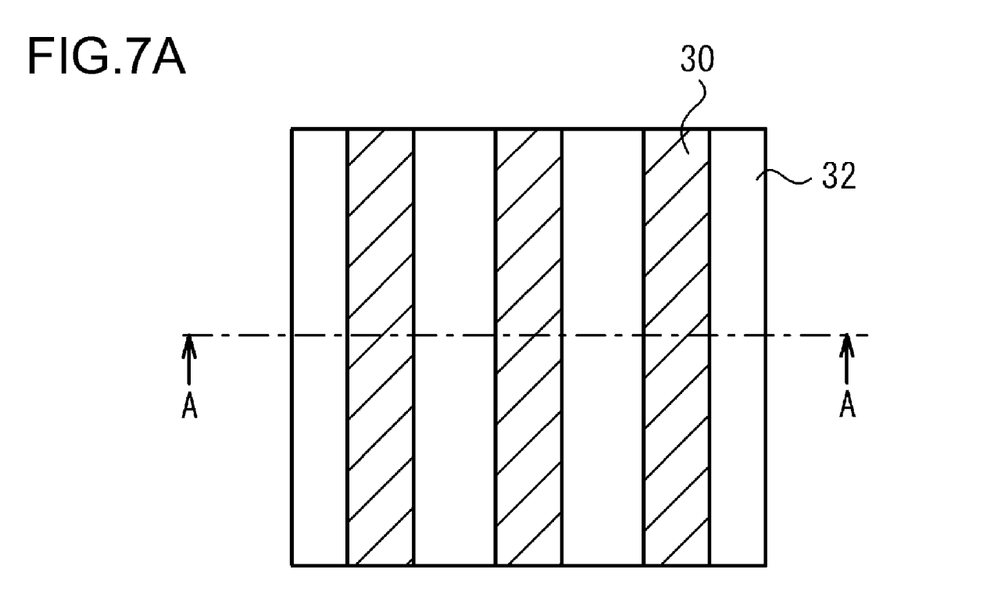
FIG. 7A is a top view formation of an insulating film in a method for manufacturing the flash memory according to one embodiment.
Figure 7B:
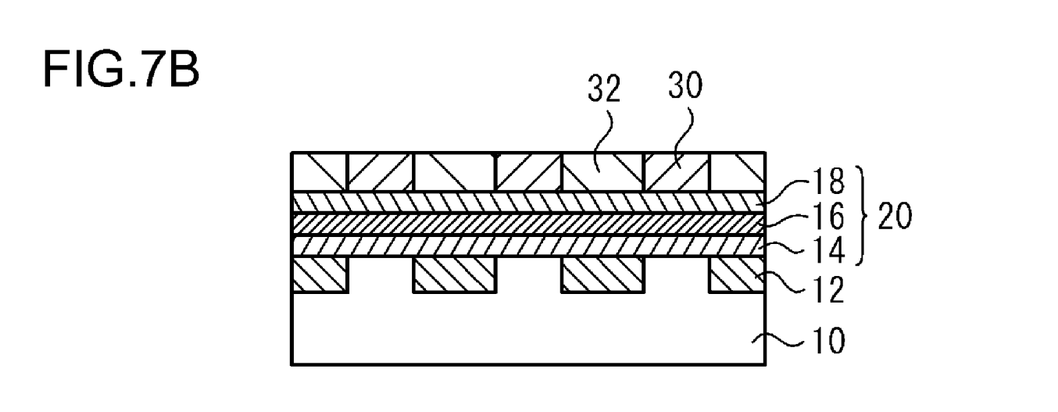
FIG. 7B is a sectional view corresponding to the one taken along line A-A shown in FIG. 3.

Referring to FIGS. 7A and 7B, a first insulating film 32 is formed as a silicon oxide film through a high density plasma CVD process on the ONO film 20 to cover the conducting films 30. Thereafter, the first insulating film 32 is polished through a CMP (Chemical Mechanical Polishing) process to become flush with the upper surface of the conducting film 30. As a result, the first insulating films 32 are formed between the adjacent conducting films 30.

Figure 8A:
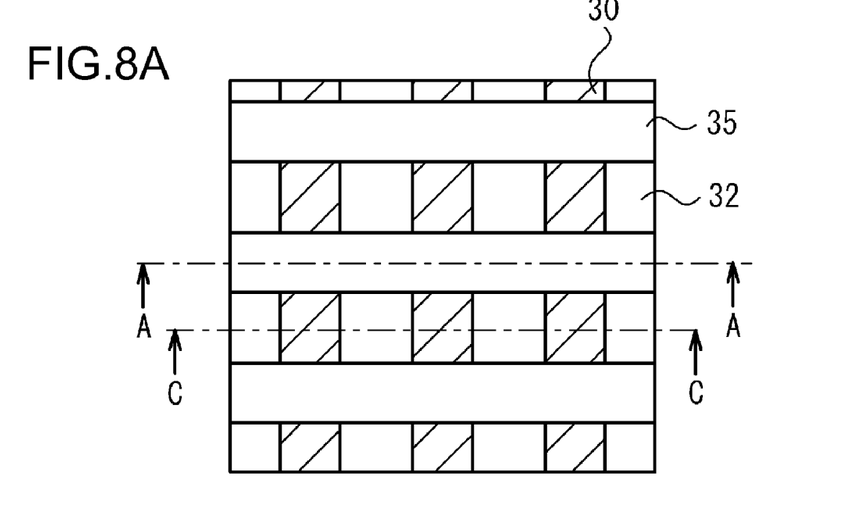
FIG. 8A is a top view showing formation of a mask layer in a method for manufacturing the flash memory according to one embodiment.
Figure 8B:
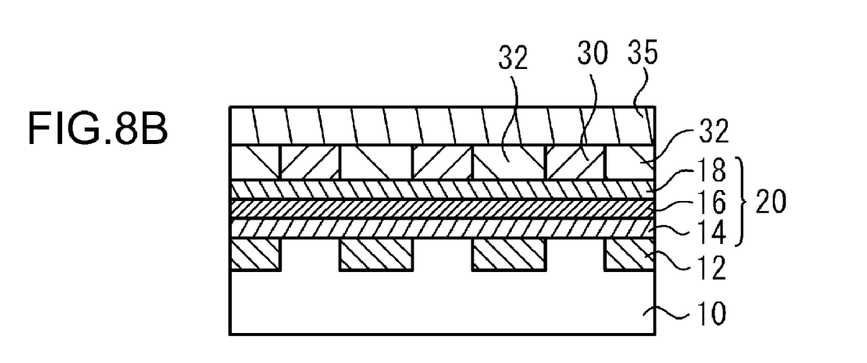
FIGS. 8B and 8C are sectional views respectively corresponding to those taken along lines A-A and C-C shown in FIG. 3.
Figure 8C:
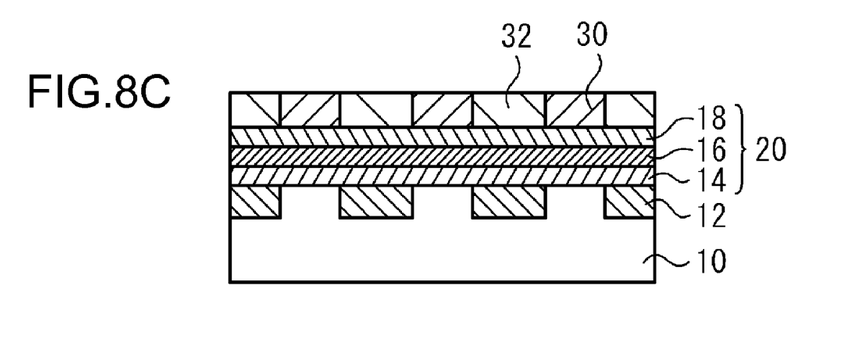
Figure 9A:
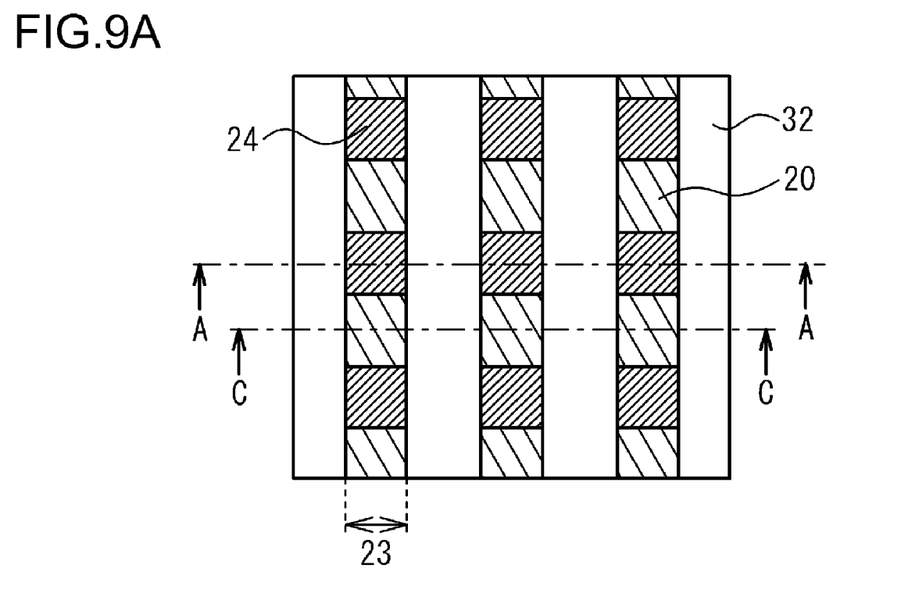
FIG. 9A is a top view showing etching of a conducting film in a method for manufacturing the flash memory according to the first embodiment.
Figure 9B:
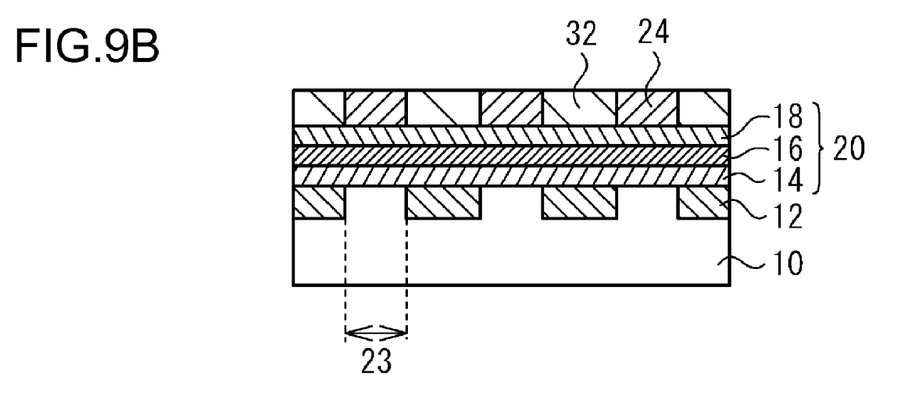
FIGS. 9B and 9C are sectional views respectively corresponding to those taken along lines A-A and C-C shown in FIG. 3.
Figure 9C:
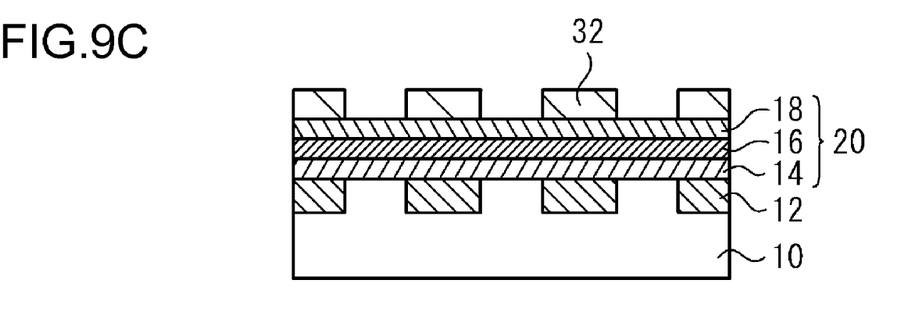

Referring to FIGS. 8A to 8C, a mask layer 35 is formed on the conducting film 30 as a photoresist which extends to intersect with the conducting film 30. Referring to FIGS. 9A to 9C, the conducting film 30 is etched through an RIE (Reactive Ion Etching) process using the mask layer 35 as a mask. As a result, the gates 24 each as the conducting film 30 are formed on the ONO film 20 above the interspace 23 between the bit lines 12, along the longitudinal direction of the bit line 12.

Figure 10A:
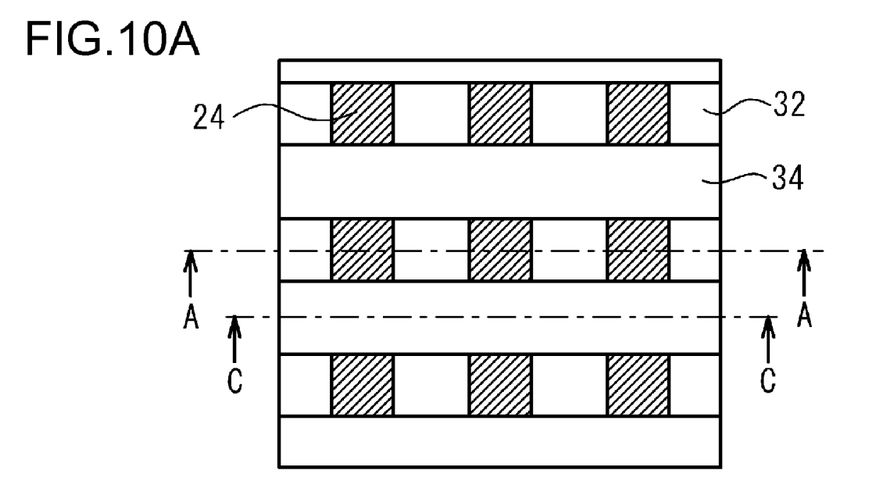
FIG. 10A is a top view showing formation of a second insulating film in a method for manufacturing the flash memory according to one embodiment.
Figure 10B:
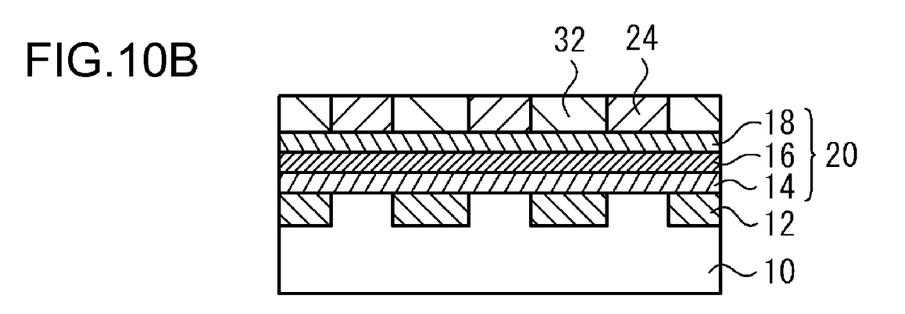
FIGS. 10B and 10C are sectional views respectively corresponding to those taken along lines A-A and C-C shown in FIG. 3.
Figure 10C:
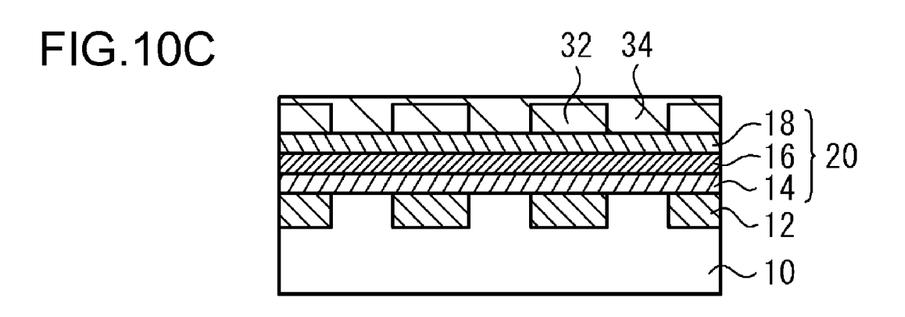

Referring to FIGS. 10A to 10C, a second insulating film 34 is formed as a silicon oxide film through the high density plasma CVD process on the ONO film 20 to cover the gates 24. The second insulating film 34 is then polished through the CMP process to become flush with each upper surface of the gates 24. The second insulating films 34 are formed between the adjacent gates 24 along the longitudinal direction of the bit line 12.

Figure 11A:
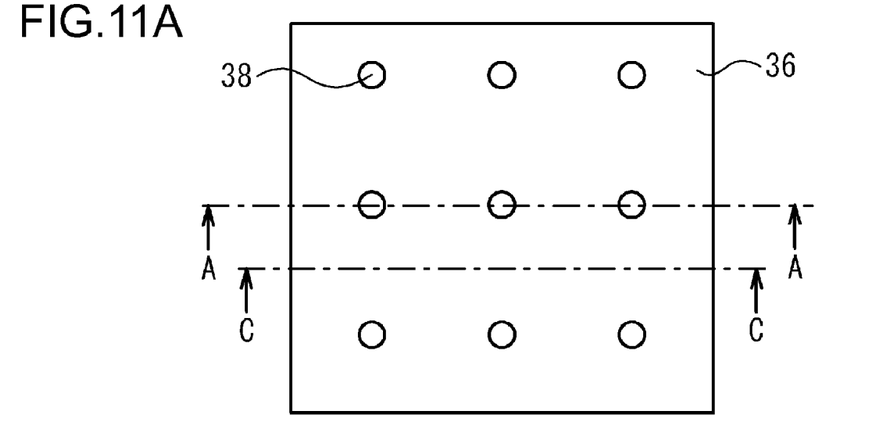
FIG. 11A is a top view showing formation of a third insulating film in a method for manufacturing the flash memory according to one embodiment.
Figure 11B:
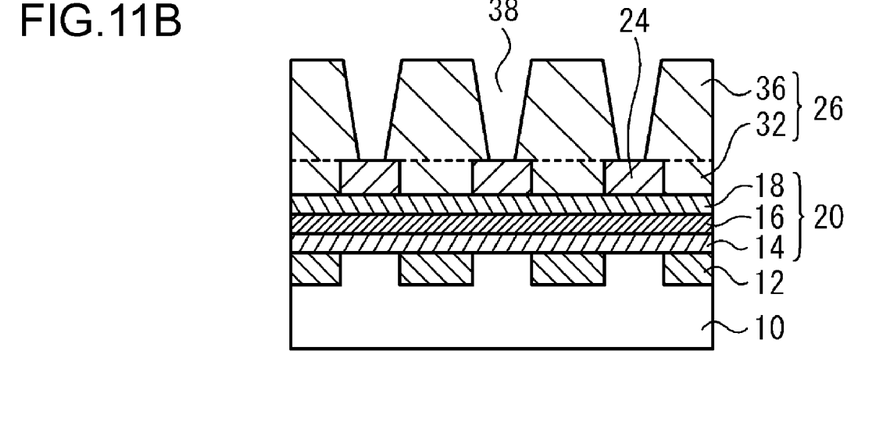
FIGS. 11B and 11C are sectional views respectively corresponding to those taken along lines A-A and C-C shown in FIG. 3.
Figure 11C:
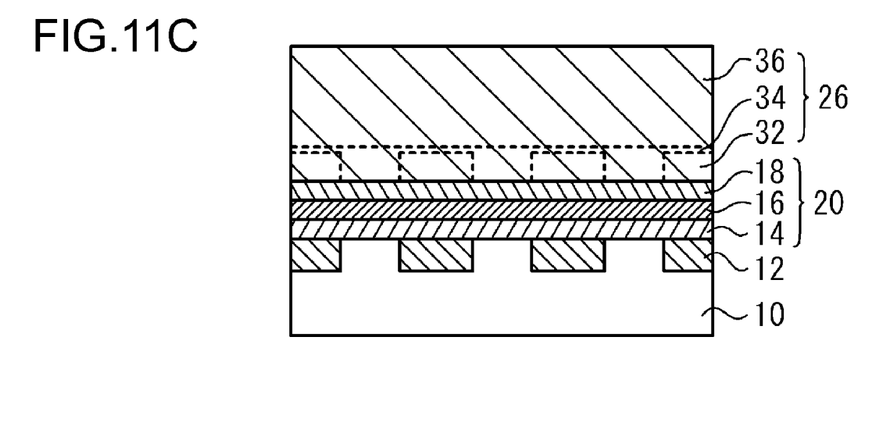

Referring to FIGS. 11A to 11C, a third insulating film 36 is formed as a BPSG (Boro-Phospho Silicated Glass) film through the CVD process on the first insulating film 32 and the second insulating film 34. The insulating film 26 formed of the first insulating film 32, the second insulating film 34 and the third insulating film 36 is formed to cover the gates 24. The third insulating film 36 formed on the respective gates 24 is etched through, for example, the RIE process using a photoresist with a predetermined pattern formed on the third insulating film 36. As a result, through holes 38 which pierce through the third insulating film 36 are formed above the respective gates 24.

Figure 12A:
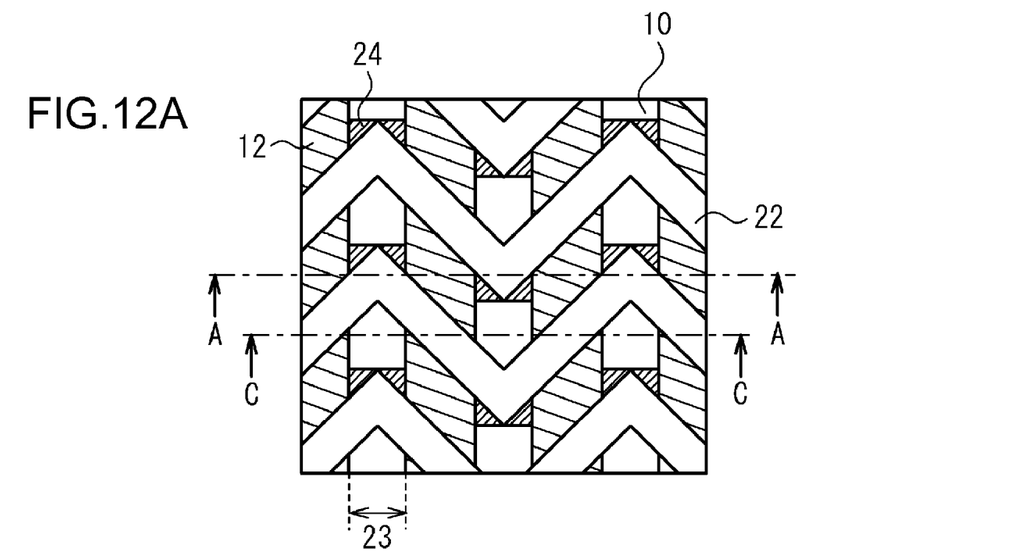
FIG. 12A is a top view showing formation of plug metals in a method for manufacturing the flash memory according to one first embodiment.
Figure 12B:
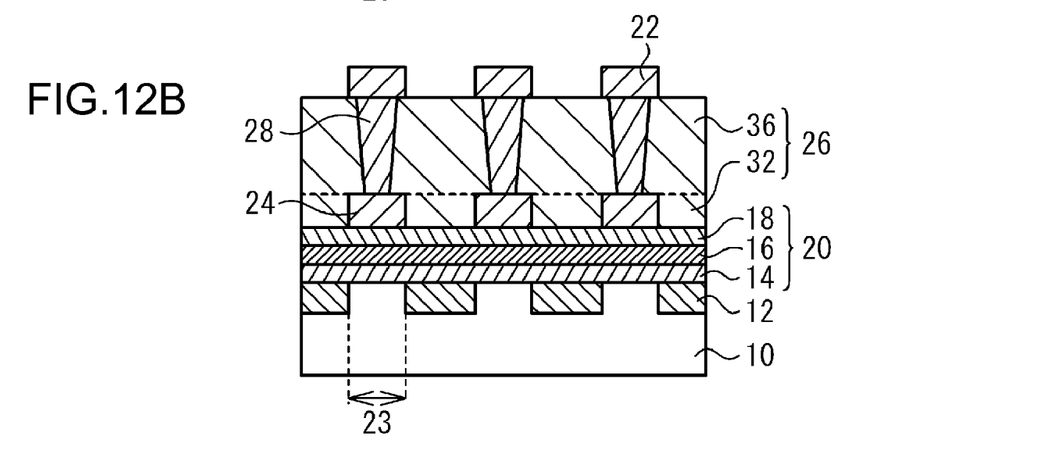
FIGS. 12B and 12C are sectional views respectively corresponding to those taken along lines A-A and C-C shown in FIG. 3.
Figure 12C:
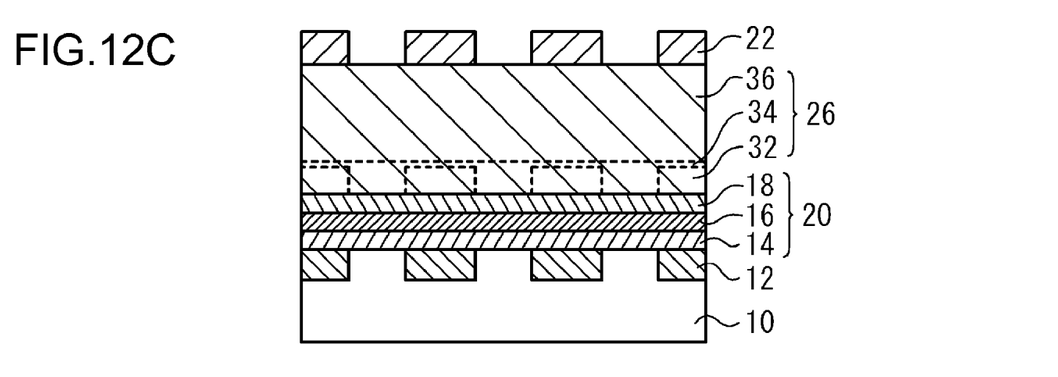

Referring to FIGS. 12A to 12C, the plug metals 28 are formed on the respective gates 24 by burying metal such as W (tungsten) in the through holes 38. The word lines 22 are formed on the plug metals 28 to extend to intersect with the bit lines 12 and to be electrically coupled with different gates 24 adjacent to each other in the width direction of the bit line 12. The word line 22 may be formed of metal such as Al (aluminum). In this way, the flash memory according to the first embodiment is produced. FIG. 12A shows the bit lines 12, the gates 24 and the semiconductor substrate 10 viewed through the ONO film 20 and the insulating film 26.

In the first embodiment, the gates 24 are formed on the ONO film 20 above the respective interspaces 23 along the longitudinal direction of the bit line 12 as shown in FIG. 3. Those gates 24 arranged at intervals of the single cell are electrically separated. Two adjacent gates 24 in the width direction of the bit line 12 are electrically coupled with different word lines 22. This makes it possible to apply different voltages to the two adjacent gates 24, respectively.

Figure 13:
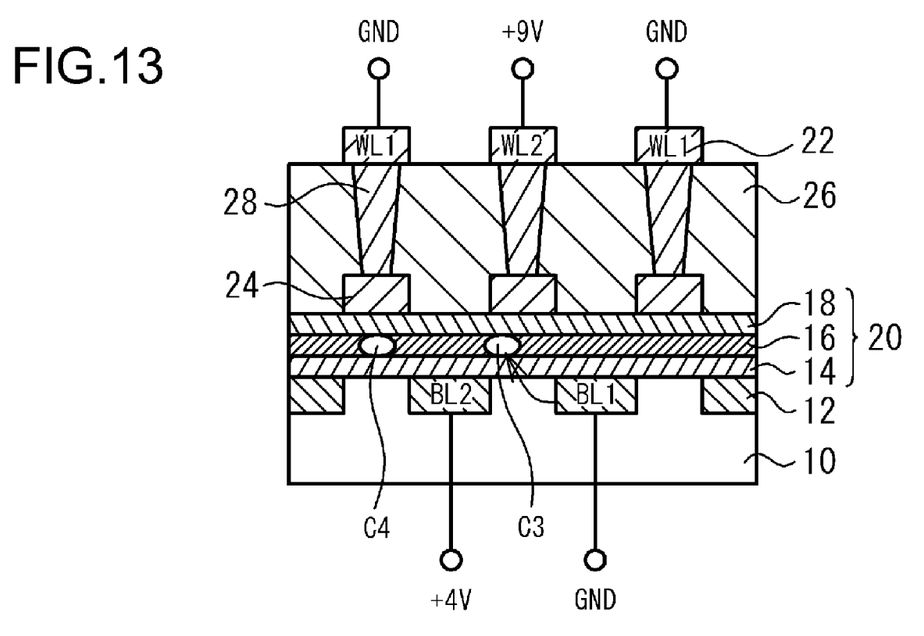
FIG. 13 is a sectional view of the flash memory according to the first embodiment, showing the effect derived therefrom.

Referring to FIG. 13, the bit line 12 (BL1) is connected to the GND, and the bit line 12 (BL2) receives a voltage of +4V. The word line 22 (WL2) receives a voltage of +9V, and the word line 22 (WL1) is connected to the GND. In the aforementioned case, most of the electrons are accumulated in a charge storage region C3 under the influence of a hot electron effect. As the bit line 12 has a small depth, some of the electrons jump over the bit line 12 (BL2) to proceed toward the adjacent cell. As the word line 22 (WL1) of the adjacent cell is connected to the GND, the electrons are not implanted into a charge storage region C4 where no electrons are accumulated, thus suppressing TPD. The first embodiment allows the memory cell to be miniaturized while suppressing the TPD. Referring to FIG. 13, the word line 22 (WL1) is connected to the GND. However, it may be structured to apply a negative voltage or structured to be uncoupled to provide similar effects.

In the manufacturing method according to the first embodiment, the conducting films 30 each extending on the ONO film 20 are formed as shown in FIGS. 5A and 5B. Referring to FIGS. 6A and 6B, the bit lines 12 are formed in the semiconductor substrate 10 using the conducting films 30 as a mask. This makes it possible to form the bit lines 12 in self-alignment with the conducting films 30 (that is, the gates 24).

Referring to FIGS. 8A to 8C, the mask layer 35 extending to intersect with the conducting layers 30 is formed thereon. Referring to FIGS. 9A to 9C, the conducting films 30 are etched using the mask layer 35 as a mask to form the gates 24 each as the conducting film 30 along the longitudinal direction of the bit line 12. This makes it possible to easily form the gates 24 along the longitudinal direction of the bit line 12.

Referring to FIGS. 12A to 12C, the word lines 22 are formed to be electrically coupled with the gates 24 on the single interspace 23, and extend to intersect with the bit lines 12. In this structure, the two adjacent gates 24 in the width direction of the bit line 12 are connected to the different word lines 22. This makes it possible to provide the semiconductor device capable of miniaturizing the memory cell while suppressing the TPD.

In the manufacturing method according to the first embodiment, the first insulating film 32 is formed to cover the conducting films 30 as shown in FIGS. 7A and 7B, and is polished through the CMP process to be interposed between the adjacent conducting films 30. Referring to FIGS. 10A to 10C, the second insulating film 34 is formed to cover the gates 24, and is polished through the CMP process to be interposed between the adjacent gates 24 in the longitudinal direction of the bit line 12. Referring to FIGS. 11A to 11C, the third insulating film 36 is formed on the first insulating film 32 and the second insulating film 34. This makes it possible to easily form the insulating film 26 to cover the gates 24.

In the first embodiment, the word line 22 (WL1) electrically coupled with one of the two adjacent gates 24 (GT1 and GT2) in the width direction of the bit line 12 (the gate 24 (GT1)), is electrically coupled with the gate 24 (GT4) which is adjacent to the gate 24 (GT2) in the width direction of the bit line 12 at the side opposite the gate 24 (GT1). That is, the word line 22 extends in the width direction of the bit line 12 while forming a zigzag shape across the bit line 12. However, it is not limited to the aforementioned structure. The word line 22 may extend straight diagonal to the width direction of the bit line 12. Also in this case, the two adjacent gates 24 in the width direction of the bit line 12 are electrically coupled with the different word lines 22, thus suppressing the TPD.

In the case where the word lines 22 extend straight diagonally to the width direction of the bit line 12, the memory cell array becomes a parallelogram shape. Accordingly, the specially configured wiring substrate may be required for mounting the memory cell array on the package. Meanwhile, in the case where the word lines 22 extend in the width direction of the bit line 12 while forming the zigzag shape across the bit lines 12, the memory cell array becomes a rectangular shape. The resultant memory cell array may be mounted on a generally employed package. In other words, a commercially available wiring substrate may be employed.

Preferably, the word line 22 (WL1) which is electrically coupled with one of two adjacent gates 24 (GT1 and GT2) in the width direction of the bit line 12, (gate 24 (GT1)), is electrically coupled with the gate 24 (GT4) adjacent to the gate 24 (GT2) in the width direction of the bit line 12 at the side opposite the gate 24 (GT1).

The word line 22 (WL1) electrically coupled with one of the two adjacent gates 24 (GT1 and GT2) in the width direction of the bit line 12 (gate 24 (GT1)), may be electrically coupled with the gate 24 arranged at the interval of two or three cells with respect to the gate 24 (GT1) in the width direction of the bit line 12. In other words, the word line 22 (WL1) may be electrically coupled with any gate 24 arranged at the interval with respect to the gate 24 (GT1) in the width direction of the bit line 12. Also in this case, the word line 22 extends in the width direction of the bit line 12 while forming a zigzag shape to intersect with the bit line 12. This makes it possible to provide a rectangular shaped memory cell array which may be mounted on a generally employed package.

Preferably, the word line 22 (WL1) electrically coupled with one of the two adjacent gates 24 (GT1 and GT2) in the width direction of the bit line 12, (that is, the gate 24 (GT1)) is electrically coupled with the gate 24 (GT4) adjacent to the gate 24 (GT2) in the width direction of the bit line 12 at the side opposite the gate 24 (GT1). In this case, the word line 22 (WL1) electrically coupled with the gate 24 (GT1) makes the size of the memory cell array smaller compared to the case where the word line 22 (WL1) is electrically coupled with the gate 24 arranged at the interval of two or three cells in the width direction of the bit line 12 with respect to the gate 24 (GT1).

Referring to FIG. 3, the word line 22 (WL1) electrically coupled with one of the two adjacent gates (GT1 and GT2) in the width direction of the bit line 12 (that is, the gate 24 (GT1)), is electrically coupled with the gate 24 (GT3) adjacent to the gate 24 (GT2) in the longitudinal direction of the bit line 12. However, it is not limited to the aforementioned structure. The word line 22 (WL1) electrically coupled with the gate 24 (GT1) may be electrically coupled with the gate 24 at the interval of the single cell or two cells in the longitudinal direction of the bit line 12 with respect to the gate 24 (GT2).

Preferably the word line 22 (WL1) electrically coupled with one of the two adjacent gates 24 (GT1 and GT2) in the width direction of the bit line 12 (the gate 24 (GT1)), is electrically coupled with the gate 24 (GT3) adjacent to the gate 24 (GT2) in the longitudinal direction of the bit line 12. In this case, the word line 22 (WL1) electrically coupled with the gate 24 (GT1) makes the size of the memory cell array smaller compared to the case where the word line 22 (WL1) is electrically coupled with the gate 24 arranged at the interval of the single cell or two cells in the width direction of the bit line 12 with respect to the gate 24 (GT2).

Referring to FIGS. 4A and 4B, the word line 22 is formed on the plug metal 28 which pierces through the insulating film 26 to cover the gate 24. However, it is not limited to the aforementioned structure. The word line 22 may be formed on the insulating film 26 without forming the plug metal 28 on the gates 24 so long as the gates 24 are electrically coupled with the word lines 22. Alternatively, the word lines 22 may be directly formed on the gates 24 without forming the insulating film 26. In the first embodiment, the word line 22 is formed of such metal as Al. However, it is not limited to the aforementioned material. The word line 22 may be formed of polysilicon.

Since the word line 22 is formed through an etching process, it is difficult to form the polysilicon word line 22 directly on the polysilicon gate 24. Because a part of the gate 24 is not covered with the word line 22 (see FIG. 3), it is difficult to etch only the word line 22 without etching the gate 24. Therefore, preferably, the word line 22 is formed of a material, such as a metal, which has an etching selectivity different from that of the material for forming the gate 24. Especially when the word line 22 is formed on the insulating film 26, the gate 24 is not etched while etching is performed for forming the word line 22. Therefore, it is more preferable to form the word line 22 on the insulating film 26.

Referring to FIGS. 4A and 4B, the charge storage layer 16 is formed of the silicon nitride film. However, it is not limited to the aforementioned material. Any element formed of another material such as a floating gate may be employed so long as electric charge can be held. In one embodiment, the semiconductor device includes a virtual ground type memory cell where the charge storage layer 16 has two different charge storage regions. However, it is not limited to the aforementioned structure. As the virtual ground type memory cell generally uses the hot electron effect as a process for accumulating electrons in the charge storage layer 16, TPD is likely to occur. This makes it possible to provide an improved effect for suppressing the TPD.

Although the preferred embodiment of the present invention has been described, it is to be understood that the present invention is not limited to the above-described specific embodiment and, within the spirit and scope of the present invention as defined in the appended claims, various modifications and alterations may be made.

The invention claimed is:

1. A semiconductor device comprising:
    a charge storage layer formed on a semiconductor substrate;
    a plurality of bit lines, each bit line of the plurality of bit lines extending inside the semiconductor substrate;
    a plurality of interspaces, each interspace of the plurality of interspaces being interposed between adjacent bit lines of the plurality of bit lines;
    a plurality of gates formed on the charge storage layer above the plurality of interspaces along a longitudinal direction of the plurality of bit lines; and
    a plurality of word lines electrically coupled with the plurality of gates formed on an interspace of the plurality of interspaces, each word line of the plurality of word lines extending to intersect with the plurality of bit lines,
    wherein a first gate of the plurality of gates is adjacent to a second gate of the plurality of gates in a width direction of a bit line, and the first gate is connected to a different word line than the second gate and wherein a word line electrically coupled with the first gate is also electrically coupled with the gate adjacent to the first gate in the width direction of the bit line at a side opposite to the first gate.

2. The semiconductor device according to claim 1, wherein a word line electrically coupled with the first gate is also electrically coupled with a third gate of the plurality of gates, the third gate disposed in a width direction of a bit line with respect to the first gate.

3. The semiconductor device according to claim 1, wherein a word line electrically coupled with either the first gate or the second gate is electrically coupled with the gate adjacent to the other of the first gate or the second gate in a longitudinal direction of the bit line.

4. The semiconductor device according to claim 1, further comprising an insulating film to cover the plurality of gates, wherein, the plurality of word lines are provided on the insulating film.

5. The semiconductor device according to claim 1, wherein an electron is stored in the charge storage layer using a hot electron effect.

6. The semiconductor device according to claim 1, wherein the semiconductor device is of a virtual ground type with a plurality of different charge storage regions in the charge storage layer.

7. A method for manufacturing a semiconductor device, comprising:
    forming a charge storage layer on a semiconductor substrate;
    forming a plurality of bit lines to extend inside the semiconductor substrate;
    forming a plurality of gates on the charge storage layer above a plurality of interspaces, each gate of the plurality of gates interposed between the adjacent bit lines in the plurality of bitlines along a longitudinal direction of the plurality of bit lines; and
    forming a plurality of word lines electrically coupled with the plurality of gates on an interspace of the plurality of interspaces, each word line of the plurality of word lines extending to intersect with the plurality of bit lines such that adjacent gates of the plurality of gates are electrically coupled with different word lines in a width direction of the bit line,
    wherein a word line electrically coupled with the second gate is also electrically coupled with the gate adjacent to the second gate in the width direction of the bit line at a side opposite to the second gate.

8. The method for manufacturing a semiconductor device according to claim 7, wherein forming the plurality bit lines comprises:
    forming a plurality of conducting films each extending on the charge storage layer; and
    forming the plurality of bit lines inside the semiconductor substrate using the conducting films as a mask.

9. The method for manufacturing a semiconductor device according to claim 8, wherein forming the plurality of gates comprises:
    forming a mask layer extending to intersect with the plurality of conducting films on the conducting films; and
    forming the plurality of gates as the conducting films by etching the plurality of conducting films.

10. The method for manufacturing a semiconductor device according to claim 8, further comprising:
    forming a first insulating film to cover the plurality of conducting films, the first insulating film being polished to be interposed between the plurality of conducting films prior to forming the plurality of gates;
    forming a second insulating film to cover the plurality of gates, the second insulating film being polished to be interposed between the adjacent gates in a longitudinal direction of the bit line subsequent to forming the plurality of gates; and
    forming a third insulating film on the first and the second insulating films.

* * * * *